United States Patent [19]

Nelson

[11] Patent Number: 4,507,618
[45] Date of Patent: Mar. 26, 1985

[54] COMPENSATION METHOD AND APPARATUS FOR AN RC ATTENUATOR

[75] Inventor: Theodore G. Nelson, Beaverton, Oreg.

[73] Assignee: Tektronix, Inc., Beaverton, Oreg.

[21] Appl. No.: 432,491

[22] Filed: Oct. 4, 1982

[51] Int. Cl.³ ............................ H03F 3/68; H01P 1/22
[52] U.S. Cl. .................................. 330/126; 330/151; 333/81 R
[58] Field of Search ............... 330/126, 151, 284, 304; 333/28 R, 81 R; 307/540, 555

[56] References Cited

U.S. PATENT DOCUMENTS 3,883,832   5/1975   Fosgate .............................. 333/81 R Primary Examiner—James B. Mullins
Assistant Examiner—G. Wan
Attorney, Agent, or Firm—George T. Noe

[57] ABSTRACT

A compensation method and apparatus for a roughly compensated RC attenuator using fixed resistors and fixed capacitors. Any difference of the high frequency attenuation ratio from the low frequency of DC attenuation ratio is detected and corrected by using multiplier for increasing or decreasing high frequency components at the output from such RC attenuator, thereby allowing digital or remote compensation of RC attenuator without using variable capacitors.

12 Claims, 6 Drawing Figures

COMPENSATION METHOD AND APPARATUS FOR AN RC ATTENUATOR

BACKGROUND OF THE INVENTION

This invention relates generally to a wideband RC attenuator, and more specifically to a compensation method and apparatus for such an attenuator.

An RC attenuator comprising series and shunt resistors each paralleled by a capacitor disposed between input and output terminals has widely been used to provide desired signal attenuation over wide frequencies. Such an RC attenuator is particularly useful for the input circuit of electrical test and measurement instruments such as, for example, oscilloscopes, digital voltmeters, etc. to minimize the loading effect to the signal source to be measured.

One typical example of high impedance RC attenuators is shown in FIG. 1 and comprises L-shaped arms of resistors $R_1$, $R_2$ and capacitors $C_1$, $C_2$ connected between input terminals $10a$–$10b$ and output terminals $12a$–$12b$. The attenuation factor ATT is given by the following expression:

$$ATT = \frac{Z_2}{Z_1 + Z_2} = \frac{\frac{R_2}{1 + j\omega C_2 R_2}}{\frac{R_1}{1 + j\omega C_1 R_1} + \frac{R_2}{1 + j\omega C_2 R_2}} = \frac{\frac{R_2}{1 + j\omega C_2 R_2}}{\frac{1 + j\omega C_2 R_2}{1 + j\omega C_1 R_1} R_1 + R_2} \quad (1)$$

Assuming that $C_1 R_1 = C_2 R_2$, then the expression (1) will be $$ATT = \frac{R_2}{R_1 + R_2} \quad (2)$$

The expressions (1) and (2) suggest that the attenuation factor ATT is frequency independent if $C_1 R_1 = C_2 R_2$ and is determined only by resistors $R_1$ and $R_2$. In FIG. 2, waveforms (A) through (D) are provided to aid in understanding the attenuator in FIG. 1, wherein waveform (A) is an input squarewave signal applied to input terminals $10a$–$10b$, and waveforms (B) through (D) are output waveforms at output terminals $12a$–$12b$. The output will be waveform (B) when variable capacitance $C_1$ is adjusted to meet the $R_1 C_1 = R_2 C_2$ condition for the flat frequency response over wide frequency range, or waveform (C) when $$C_1 > \frac{R_2}{R_1} C_2$$

(over compensation), or waveform (D) when $$C_1 < \frac{R_2}{R_1} C_2.$$

For accurate measurement or attenuation of the input signal over wide frequencies and various waveforms, capacitance $C_1$ must be adjusted so that $$C_1 = \frac{R_2}{R_1} C_2.$$

One conventional technique to satisfy the $R_1 C_1 = R_2 C_2$ relationship is to use a variable capacitor as either $C_1$ or $C_2$ and manually control it so that the correct rectangular output is reproduced at output terminals $12a$–$12b$ as shown by waveform (B) in FIG. 2. If $C_1$ is larger than the correct capacitance, sharp edges appear at transitions of the rectangular waveform as shown in waveform (C) of FIG. 2, which represents that higher frequency components of the input signal are attenuated less than DC and lower frequency components. On the other hand, waveform (D) shows the condition when $C_1$ is smaller than the correct capacitance, thereby losing higher frequency components so as to fail to reproduce the input rectangular waveform accurately.

There are certain cases in which manual adjustment of such attenuator capacitor is impossible, difficult, or impractical. This may happen, for example, when the input voltage is very high or when there is no access to such capacitor because of a physical limitation of the equipment using the attenuator. Adjustable capacitors of high withstand voltages of 500 volts or more are difficult to manufacture, and very expensive. Additionally, adjustable capacitors may suffer variation in electrical characteristics when used in a high temperature, high moisture environment. Further, they are not suited for remote or automatic control by the aid of a microprocessor or a computer.

SUMMARY OF THE INVENTION

To overcome the aforementioned disadvantages of the conventional manually adjustable RC attenuators, the attenuator according to this invention utilizes fixed resistors paralleled by fixed capacitors (which may be either physical components or stray capacitors). Any incorrect frequency response of such fixed attenuator is detected at the output of such attenuator and electrically compensated. The error is caused because of slight mismatching in electrical value of the resistors and capacitors as well as the input capacitance of the load to be connected to the output terminals $12a$–$12b$ of such attenuator.

According to one preferred embodiment of this invention, high frequency components of the output signal from the attenuator are amplified to controllable amplitude and polarity and combined with the attenuator output signal to equalize the attenuation factors for both low and high frequency components of the input signal, thereby effectively achieving a flat frequency response over a wide frequency range. Preferably, a four quadrant multiplier may be used for such compensation. The gain and polarity of such multiplier may preferably be controlled by a microcomputer or other host computer.

It is therefore an object of this invention to provide a wideband high impedance RC attenuator using fixed resistors and fixed capacitors.

It is another object of this invention to provide an RC attenuator capable of automatic frequency response adjustment.

It is still another object of this invention to provide a high impedance RC attenuator suited for remote control of its frequency response.

It is yet another object of this invention to provide an improved method of compensating an RC attenuator using fixed resistors and capacitors.

It is a further object of this invention to provide a method of digitally compensating an RC attenuator.

It is an additional object of this invention to provide an RC attenuator for electrical measurement instruments such as oscilloscopes, digital voltmeters (DVMs), digital multimeters (DMMs), frequency counters, etc.

BRIEF DESCRIPTION OF THE DRAWINGS

Various features and advantages of the present invention will become more apparent upon consideration of the following description taken in conjunction with the accompanying drawings wherein.

DETAILED DESCRIPTION OF THE PREFERRED EMBODIMENTS

Figure 1:
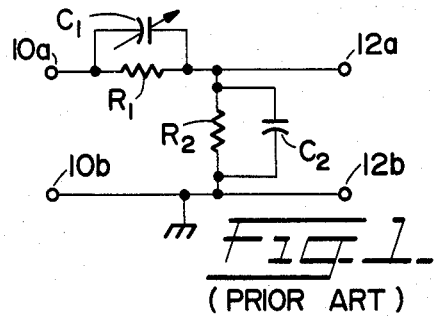
FIG. 1 illustrates the prior art high impedance RC attenuator.
Figure 2:
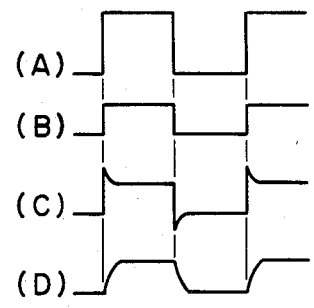
FIG. 2 is a series of waveforms for explaining the operation of the RC attenuator of FIG. 1.
Figure 3:
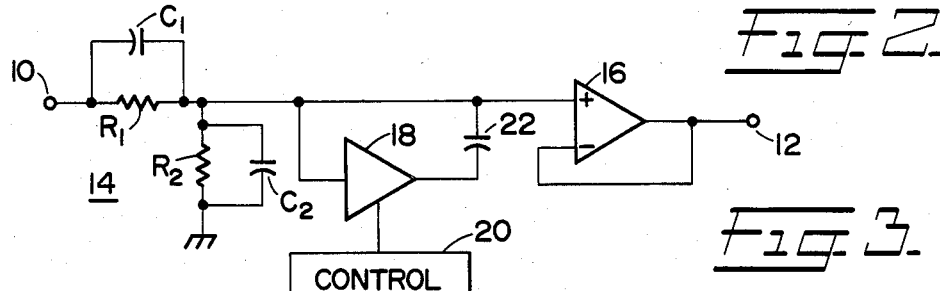
FIG. 3 is a simplified circuit schematic illustrating a principle of this invention.

The present invention features the use of fixed resistors connected in series and parallel with respect to the signal path and fixed capacitors, either in physical component or stray capacitance form, connected in parallel with the resistors. For accurate compensation for RC products of the series and shunt paths of such fixed RC attenuator, a variable gain, polarity amplifier is provided for amplifying the output from the attenuator to increase or decrease the high frequency components. That is, as shown in FIG. 3, RC attenuator 14 is similar to the conventional one except that both capacitors $C_1$ and $C_2$ are fixed rather than being adjustable. It should be understood that capacitor $C_2$ includes the input capacitance of the load connected to attenuator 14. The output from attenuator 14 is directly coupled to the input of buffer amplifier 16 having a high input impedance but a low output impedance. In addition to the first signal path, the output from attenuator 14 is routed to variable gain/polarity amplifier 18 whose output signal amplitude and polarity with respect to the input thereto are controllable under control of control circuit 20. The output from amplifier 18 is AC coupled via low capacitance coupling capacitor 22 to the input of buffer amplifier 16.

In operation, the input signal is applied through input terminal 10 and fixed RC attenuator 14 to develop an attenuated output voltage across resistor $R_2$ and capacitor $C_2$. The attenuation factor of attenuator 14 may be 100X, wherein $R_1$ is 990 kilohms and $R_2$ is 10 kilohms. Both DC and AC components of such output signal are applied to buffer amplifier 16. However, capacitive attenuator comprising $C_1$ and $C_2$ may not be compensated correctly, thereby providing lower or higher attenuation factor than the resistive attenuator $R_1$, $R_2$. The additional signal path including amplifier 18, control circuit 20 and coupling capacitor 22 provides high frequency components of the attenuator output signal in additive or subtractive phase with respect to the signal applied to buffer amplifier 16 directly through the first signal path. In this circuit arrangement, capacitor 22 acts like a Miller capacitor which tends to increase or decrease the value of $C_2$ depending on the gain of amplifier 18 and the ratio of capacitance of capacitors 22 and $C_2$. Since the additional signal path is to add or subtract only high frequency components from the attenuator output signal, capacitor 22 may alternatively be connected to the input side of amplifier rather than the output side, or even both sides, if necessary.

Compensation of attenuator 14 may be carried out in a few different ways for accurate compensation of the roughly compensated RC attenuator 14. The DC attenuation ratio of attenuator 14 is normally predetermined (e.g. 100:1) and may be unnecessary to verify. Therefore, a high frequency signal of known amplitude (e.g. 100 volts) is applied and the voltage is measured by a digital voltmeter (DVM) connected to output terminal 12. Control circuit 20 controls the gain and polarity of controllable gain/polarity amplifier 18 so that the DVM measurements show the intended value (e.g. 1.0 volt). If any error is detected, control circuit 20 provides necessary compensation to correct the output. Control circuit 20 may be a manual control DC voltage or a digital word from a built-in microprocessor or external host computer.

For achieving higher degree of harmony of the lower frequency attenuator $R_1$ and $R_2$ with the higher frequency attenuator $C_1$ and $C_2$, a known DC voltage is first applied to input terminal 10 and measured by the DVM coupled to output terminal 12. A high frequency signal of the same amplitude is then applied and measured by the DVM. By comparing the two measurements, control circuit 20 operates to equalize the second measurement to the first one, thereby compensating attenuator 14 over a wide frequency range.

Another alternative method of compensating attenuator 14 is to use a signal sampling technique. A square-wave pulse of any desired amplitude is applied to input terminal 10 and the instantaneous signal amplitudes immediately after and before succeeding pulse transitions are sampled and stored in a memory. Similarly, control circuit 20 is activated to control the high frequency amplitude so that the two stored samples are equalized.

Figure 4:
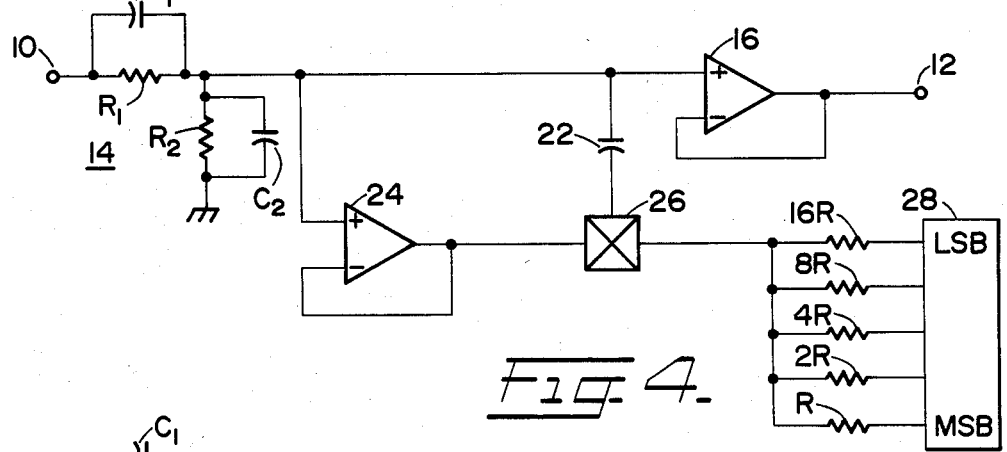
FIG. 4 illustrates the concept of a digitally controlled attenuator compensation circuit according to this invention.

FIG. 4 is a preferred embodiment of digital compensation of RC attenuator according to this invention. The output signal from the roughly adjusted attenuator 14 is directly coupled to buffer amplifier 16 through a main signal path while the second compensation signal path includes another buffer amplifier 24 coupled to the attenuator output. Coupled to the output of buffer amplifier 24 is a multiplier 26 which is preferably a four quadrant multiplier such as that disclosed in U.S. Pat. No. 3,689,752, granted to Barrie Gilbert and commonly known as the Gilbert multiplier, because of its linearity and stability under different temperatures. Any other conventional four quadrant multipliers or gain/polarity controlable amplifiers may be used as multiplier 26. Another input to multiplier 26 is a DC signal from digital control 28 such as a microprocessor or a computer. A digital word signal from digital control 28 is applied to another input of multiplier 26 through programmed resistors R, 2R, 4R, 8R and 16R.

Assuming that digital control 28 provides a five-bit digital word with the least significant bit (LSB) to resistor 16R and the most significant bit (MSB) to resistor, R, it is known that the gain of multiplier 26 is zero when the digital word is 10000. The gain increases as the digital word is above or below 10000, but the polarity of the output signal from multiplier 26 is switched, i.e., the polarity is respectively positive and negative when the word is above and below 10000. A digital word larger than five bits may be used for more accurate compensation of attenuator 14. The compensation procedure may be any one of the aforementioned techniques. This compensation is particularly useful because a microprocessor or computer replaces time consuming manual labor, thereby reducing cost, and improving performance in many products using high impedance RC attenuator.

Figure 5:
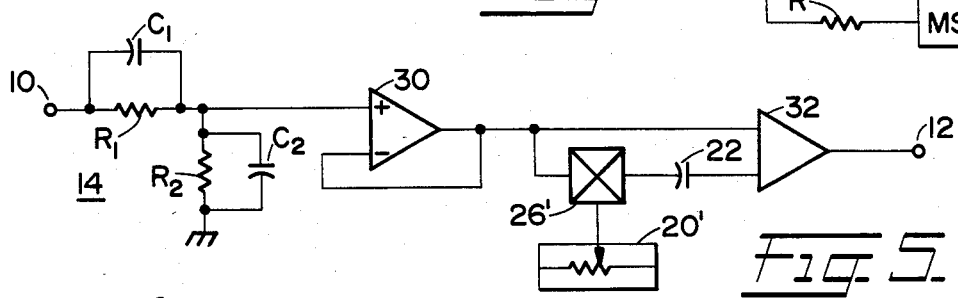
FIG. 5 is another embodiment of a compensation circuit for a high impedance attenuator.
Figure 6:
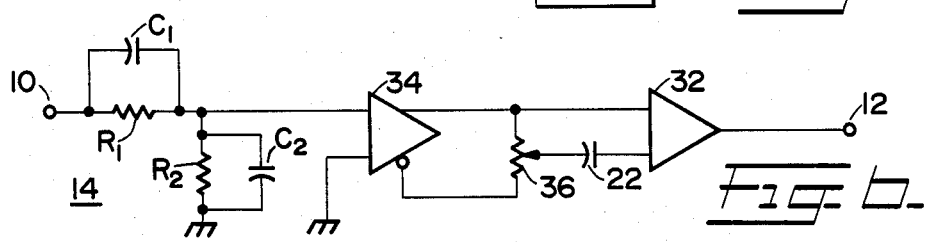
FIG. 6 is yet another embodiment of a compensation circuit for a high impedance attenuator.

Although the embodiment of FIG. 4 is advantageous in many respects, compensation of the roughly adjusted RC attenuator may be realized in alternative ways, for example, such as shown in FIGS. 5 and 6. In the FIG. 5 embodiment, the attenuator output is coupled to buffer amplifier 30 which may include a source follower FET input amplifier stage followed by emitter follower amplifier. The output of buffer amplifier 30 is supplied both to summing amplifier 32 and multiplier 26' which may be similar to four quadrant multiplier 26 in FIG. 4. The gain and polarity of multiplier 26' are under control of the DC control signal from control circuit 20', thereby providing high frequency components of the signal to summing amplifier 32 via coupling capacitor 22 to increase or decrease high frequency components applied directly to summing amplifier 32. Control circuit 20' may be adjusted manually or automatically.

FIG. 6 is different from FIG. 5 in that the attenuator output signal is applied to paraphase amplifier 34 with high input impedance serving partly as a buffer amplifier. The non-inverting output of amplifier 34 is directly applied to summing amplifier 32 and the inverting output is applied thereto via gain/polarity control potentiometer 36 and coupling capacitor 22. It is understood that the high frequency component through coupling capacitor 22 is zero at the center point of the slider of potentiometer 36 but increases in phase or out of phase when the slider is moved away from that point. The two signal paths to summing amplifier 32 are substantially the same in this embodiment, and are thereby applicable to a wideband attenuator circuit.

It may be observed in the foregoing specification that basic idea of the present invention has been described along with a few simplified embodiments so that a person having an ordinary skill in the art can apply this invention to his particular application with appropriate changes and modifications without departing from the subject matter of this invention, if necessary. For example, the controllable amplifier may be any conventional amplifier of fixed polarity (either inverting or non-inverting) if second capacitor $C_2$ of the RC attenuator is chosed fairly large or small capacitance than the nominal value. It should be noted that the foregoing descriptions and the accompanying drawings are not for limiting this invention. Consequently, the present invention should be interpreted from the appended claims.

What I claim as novel is:

1. A compensation apparatus for an attenuator having fixed resistors paralleled by fixed capacitors and an input and an output, said compensation apparatus comprising:
   circuit means for controllably amplifying high frequency components of the output signal from said attenuator; and
   summing means for algebraically summing the output of said circuit means with the output of said attenuator thereby to provided a frequency compensated output.

2. A compensation apparatus for an attenuator in accordance with claim 1 wherein said summing means comprises a buffer amplifier and said circuit means comprises a four quadrant multiplier for multiplying the output of another buffer amplifier connected to the output of said attenuator and a controllable DC voltage to provide the multiplied output through a coupling capacitor to said buffer amplifier of said summing means.

3. A compensation apparatus for an attenuator in accordance with claim 2 wherein said controllable DC voltage is generated by digital-to-analog conversion of a digital word from a microprocessor.

4. A compensation apparatus for an attenuator in accordance with claim 1 further including a buffer amplifier connected to the output of said attenuator.

5. A compensation apparatus for an attenuator in accordance with claim 1 wherein said circuit means comprises paraphase amplifier coupled to the output of said attenuator to provide a push-pull output and control means for obtaining the sum of said push-pull output in different ratios.

6. An RC attenuator, comprising:
   first and second resistors connected in series and shunt relation respectively between input and output terminals and fixed first and second capacitors connected respectively in parallel with said first and second resistors for rough frequency compensation;
   a third capacitor with one terminal thereof connected to said output terminal; and
   a multiplier for multiplying the output from said output terminal and a controllable DC voltage to provide the output to the other end of said third capacitor.

7. An RC attenuator in accordance with claim 6 wherein said multiplier is a four quadrant multiplier.

8. An RC attenuator in accordance with claim 6 wherein said controllable DC voltage is manually controlled.

9. An RC attenuator in accordance with claim 6 wherein said controllable DC voltage is a digital word from a microprocessor converted into analog value.

10. A digital compensation circuit for an attenuator, comprising:
    a roughly compensated RC attenuator including fixed resistors and fixed capacitors forming low and high frequency attenuators;
    an amplifier for amplifying the output signal from said RC attenuator; and
    a multiplier for providing the high frequency components in the output from said RC attenuator in controllable gain and polarity in response to a digital word from a digital control.

11. A compensation method for an RC attenuator made of fixed resistors and fixed capacitors, comprising the steps of:
    comparing the attenuation ratios of said attenuator to low and high frequency input signals; and
    increasing or decreasing the attenuation ratio to the high frequency input signal until the two attenuation ratios are equalized by adding or subtracting the high frequency comonents to the output from said attenuator.

12. A compensation method for an RC attenuator in accordance with claim 11 wherein said increasing or decreasing the attenuation ratio to the high frequency signal is made by applying a digital word to a four quadrant multiplier in such a manner that the difference in the high frequency attenuation ratio reaches the low frequency attenuation ratio.

* * * * *